United States Patent [19]

Nam

[11] Patent Number: 5,608,675
[45] Date of Patent: Mar. 4, 1997

[54] CURRENT CONTROL CIRCUIT FOR SENSE AMPLIFIER

[75] Inventor: Jong G. Nam, Kyoungki-do, Rep. of Korea

[73] Assignee: Hyundai Electronics Industries Co. Ltd., Kyoungki-do, Rep. of Korea

[21] Appl. No.: 498,572

[22] Filed: Jul. 6, 1995

[30] Foreign Application Priority Data

Jul. 7, 1994 [KR] Rep. of Korea .................. 94-16282

[51] Int. Cl.$^6$ ........................................ G11C 7/00
[52] U.S. Cl. .............. 365/189.06; 365/222; 365/207
[58] Field of Search ........................ 365/189.06, 222, 365/207, 149, 230.03

[56] References Cited

U.S. PATENT DOCUMENTS 5,280,452  1/1994  Dhong et al. ....................... 365/205

FOREIGN PATENT DOCUMENTS 4353693  12/1992  Japan ................................. 365/203

Primary Examiner—David C. Nelms
Assistant Examiner—Haun Hoang
Attorney, Agent, or Firm—Gary M. Nath; Nath & Associates

[57] ABSTRACT

A current control circuit for a dynamic random access memory device which has a bit line sense amplifier for sensing and amplifying bit data on a bit line, and a data bit clamping circuit for supplying current to the bit line sense amplifier. The current control circuit is adapted to control the current from the data bit clamping circuit to the bit line sense amplifier. The current control circuit comprises a first path switching circuit for forming a current path from the data bit clamping circuit to the bit line sense amplifier during a refresh operation, a second path switching circuit connected between the first path switching circuit and the data bit clamping circuit, for opening/closing the current path, and a path controller for generating a current control signal in response to an address signal and supplying the generated current control signal to the second path switching circuit.

4 Claims, 2 Drawing Sheets

CURRENT CONTROL CIRCUIT FOR SENSE AMPLIFIER

BACKGROUND OF THE INVENTION

1. Field of the Invention

The present invention relates to a current control circuit used in a dynamic random access memory (referred to hereinafter as DRAM) device to control current which is supplied from a data bit clamping circuit to a bit line sense amplifier.

2. Description of the Prior Art

Generally, a DRAM device comprises a plurality of memory blocks, each of which includes a plurality of DRAM cells. In order to make it more convenient for the user to operate, the DRAM device has been designed in such a manner that all the memory blocks, a part of the memory blocks or only one of the memory blocks can be refreshed.

The DRAM device includes a bit line sense amplifier for sensing and amplifying bit data on a bit line, a data bit clamping circuit for supplying current to the bit line sense amplifier, and a current control circuit for switching the current which is supplied from the data bit clamping circuit to the bit line sense amplifier. When the DRAM device is conducting a refresh operation, however, the current control circuit allows the current to be supplied to the bit line sense amplifier regardless of the refresh mode by memory blocks, resulting in unnecessary power consumption of the DRAM device. The problem with such a conventional current control circuit for a sense amplifier will hereinafter be described in detail with reference to FIG. 1.

Referring to FIG. 1, the construction of a conventional current control circuit is schematically shown. As shown in this drawing, the conventional current control circuit comprises a pair of NMOS transistors Q1 and Q2 connected to first and second current paths between a data bit clamping circuit 10 and a bit line sense amplifier 12, respectively. The NMOS transistors Q1 and Q2 are adapted to open/close the first and second current paths according to a logic state of a current control signal from an input line 11, respectively. The current control signal from the input line 11 is generated from a global decoder (not shown) and becomes high in logic when at least one of the memory blocks is refreshed. In response to the current control signal from the input line 11, the NMOS transistors Q1 and Q2 are operated when the corresponding memory block is conducting the refresh operation, to allow the current to be supplied to the bit line sense amplifier 12 regardless of the refresh mode of a different memory block. For this reason, the unnecessary power consumption occurs in the DRAM device.

SUMMARY OF THE INVENTION

Therefore, the present invention has been made in view of the above problem, and it is an object of the present invention to provide a current control circuit for a sense amplifier which is capable of preventing unnecessary power consumption in a DRAM device.

In according with the present invention, in a dynamic random access memory device having a bit line sense amplifier for sensing and amplifying bit data on a bit line, and a data bit clamping circuit for supplying current to the bit line sense amplifier, there is provided a circuit for controlling the current from the data bit clamping circuit to the bit line sense amplifier. The current control circuit comprises: first path switching means for forming a current path from the data bit clamping circuit to the bit line sense amplifier during a refresh operation; second path switching means connected between the first path switching means and the data bit clamping circuit, for opening/closing the current path; and path control means for generating a current control signal in response to an address signal and supplying the generated current control signal to the second path switching means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
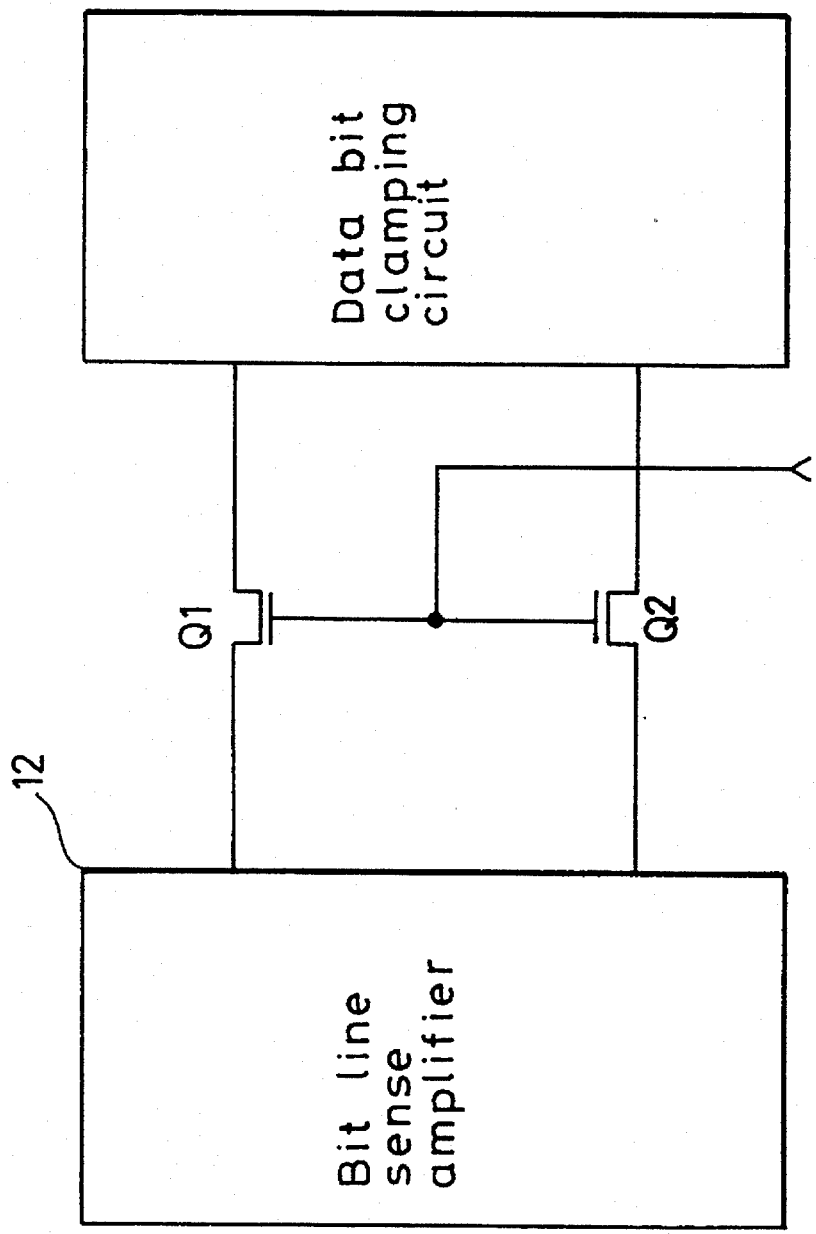
FIG. 1 is a schematic view illustrating the construction of a conventional current control circuit for a sense amplifier.
Figure 2:
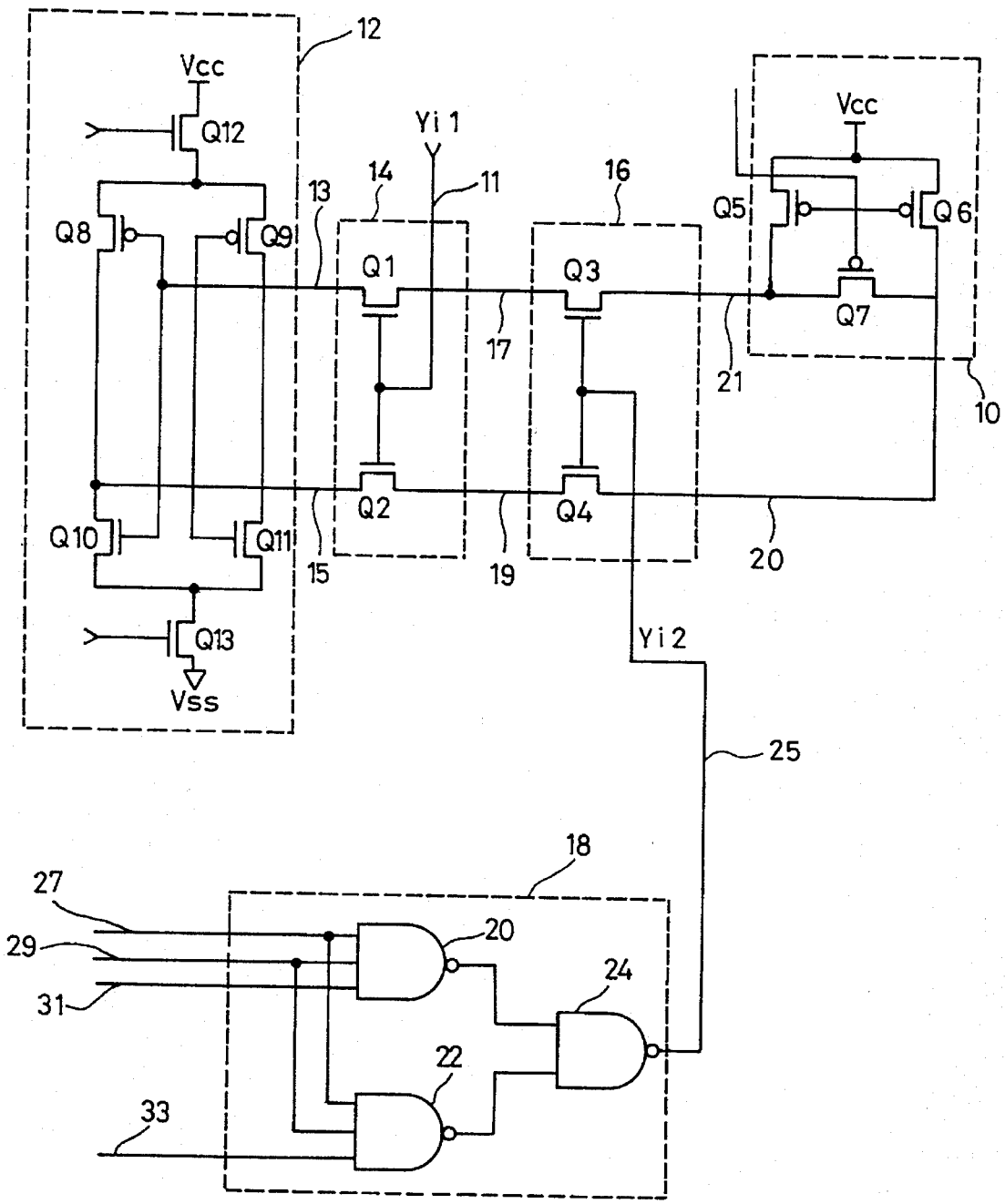
FIG. 2 is a circuit diagram of a current control circuit for a sense amplifier in accordance with an embodiment of the present invention.

Referring to FIG. 2, there is shown a circuit diagram of a current control circuit for a sense amplifier in accordance with an embodiment of the present invention. As shown in this drawing, the current control circuit comprises first and second path switching circuits 14 and 16 connected between a data bit clamping circuit 10 and a bit line sense amplifier 12. The data bit clamping circuit 10 includes three PMOS transistors Q5–Q7. The bit line sense amplifier 12 includes three PMOS transistors Q8, Q9 and Q12 and three NMOS transistors Q10, Q11 and Q13. The data bit clamping circuit 10 and the bit line sense amplifier 12 are well-known in the art and details thereof will thus be omitted.

The first path switching circuit 14 includes a first NMOS transistor Q1 connected between a first input line 13 of the bit line sense amplifier 12 and a first connection line 17, and a second NMOS transistor Q2 connected between a second input line 15 of the bit line sense amplifier 12 and a second connection line 19. The first NMOS transistor Q1 has a gate for inputting a first current control signal Yi1 from an input line 11. When the first current control signal Yi1 from the input line 11 is high in logic, the first NMOS transistor Q1 is turned on to transfer a voltage/current signal from the first connection line 17 to the first input line 13 of the bit line sense amplifier 12. Similarly, the second NMOS transistor Q2 has a gate for inputting the first current control signal Yi1 from the input line 11. When the first current control signal Yi1 from the input line 11 is high in logic, the second NMOS transistor Q2 is turned on to transfer a voltage/current signal from the second connection line 19 to the second input line 15 of the bit line sense amplifier 12. The first current control signal Yi1 from the input line 11 is generated from a global decoder (not shown) and becomes high in logic regardless of the refresh mode when the DRAM device is refreshed.

The second path switching circuit 16 includes a third NMOS transistor Q3 connected between a first output line 21 of the data bit clamping circuit 10 and the first connection line 17, and a fourth NMOS transistor Q4 connected between a second output line 28 of the data bit clamping circuit 10 and the second connection line 19. The third NMOS transistor Q3 has a gate for inputting a second current control signal Yi2 from an input line 25. When the second current control signal Yi2 from the input line 25 is high in logic, the third NMOS transistor Q3 is turned on to transfer a current signal from the first output line 21 of the data bit clamping circuit 10 to the first connection line 17. Similarly, the fourth NMOS transistor Q4 has a gate for inputting the second current control signal Yi2 from the input line 25. When the second current control signal Yi2 from the input line 25 is high in logic, the fourth NMOS transistor Q4 is turned on to transfer a current signal from the second output line 23 of the data bit clamping circuit 10 to the second connection line 19.

The current control circuit further comprises a path controller 18 for inputting first to fourth decoding signals from input lines 27, 29, 31 and 33. The path controller 18 includes a first NAND gate 20 for NANDing the first to third decoding signals from the input lines 27, 29 and 31, and a second NAND gate 22 for NANDing the first, second and fourth decoding signals from the input lines 27, 29 and 33. When the first to third decoding signals from the input lines 27, 29 and 31 are all high in logic, the first NAND gate 20 supplies a low logic signal to a third NAND gate 24. Similarly, when the first, second and fourth decoding signals from the input lines 27, 29 and 33 are all high in logic, the second NAND gate 22 supplies a low logic signal to the third NAND gate 24. The third NAND gate 24 generates the second current control signal Yi2 in response to output signals from the first and second NAND gates 20 and 22. The second current control signal Yi2 from the third NAND gate 24 is high in logic when the output signal from the first or second NAND gate 20 or 22 is low in logic. The third NAND gate 24 supplies the second current control signal Yi2 to the gates of the third and fourth NMOS transistors Q3 and Q4 in the second path switching circuit 16 through the input line 25 of the second path switching circuit 16 to control the operations of the third and fourth NMOS transistors Q3 and Q4. The first and second decoding signals are obtained by logically combining a refresh control signal and a column address. The first and second decoding signals act to address a DRAM cell to be refreshed. The third and fourth decoding signals are obtained by logically combining a desired number of bits of a row address. The third and fourth decoding signals act to address a memory block to be refreshed. As a result, the path controller 18 controls the second path switching circuit 16 in such a manner that the current can be supplied to the bit line sense amplifier 13 only when the memory block to be refreshed and the DRAM cell to be refreshed are addressed by the first to fourth decoding signals.

As apparent from the above description, according to the present invention, the current control circuit allows the current to be supplied to the bit line sense amplifier when the memory block including the DRAM cells is selected, so that the power consumption of the DRAM device can be minimized. Further, according to the present invention, the current control circuit allows the current to be supplied to the bit line sense amplified only when the corresponding DRAM cell is addressed. Therefore, the current control circuit of the present invention has the effect of perfectly preventing unnecessary power consumption of the DRAM device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. In a dynamic random access memory device having a bit line sense amplifier for sensing and amplifying bit data on a bit line, and a data bit clamping circuit for supplying current to said bit line sense amplifier, a circuit for controlling the current to be supplied from said data bit clamping circuit to said bit line sense amplifier, comprising:

first path switching means for forming a current path from said data bit clamping circuit to said bit line sense amplifier in response to a first current control signal from a global decoder during a refresh operation;

path control means for generating a second current control signal in response to an address signal; and second path switching means connected between said first path switching means and said at a bit clamping circuit, for opening/closing said current path in response to said second current control signal from said path control means.

2. The circuit as set forth in claim 1, wherein said second path switching means includes a MOS transistor.

3. The circuit as set forth in claim 1, wherein said path control means includes a logic element.

4. The circuit as set forth in claim 3, wherein said logic element is adapted to perform a NAND operation.

* * * * *

UNITED STATES PATENT AND TRADEMARK OFFICE
CERTIFICATE OF CORRECTION

PATENT NO. : 5,608,675
DATED : March 4, 1997
INVENTOR(S) : Nam

It is certified that error appears in the above-indentified patent and that said Letters Patent is hereby corrected as shown below:

In column 4, line 34, the text "said at a bit clamping circuit" should actually read "said data bit clamping circuit".

Signed and Sealed this

Thirteenth Day of May, 1997

*Attest:*

BRUCE LEHMAN

*Attesting Officer*     *Commissioner of Patents and Trademarks*